(12) United States Patent
Donohoe (10) Patent No.: US 6,544,895 B1
(45) Date of Patent: Apr. 8, 2003

(54) METHODS FOR USE OF PULSED VOLTAGE IN A PLASMA REACTOR

(75) Inventor: Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 09/640,449

(22) Filed: Aug. 17, 2000

(51) Int. Cl.$^7$ ............................................. H01L 21/302
(52) U.S. Cl. ........................ 438/706; 438/710; 438/712; 438/714; 438/720
(58) Field of Search .................. 438/706, 710, 438/712, 714, 720; 156/345; 216/68, 69, 71

(56) References Cited

U.S. PATENT DOCUMENTS

| | | |
|---|---|---|
| 5,315,145 A | 5/1994 | Lukaszek |
| 5,435,886 A | 7/1995 | Fujiwara et al. |
| 6,051,114 A | 4/2000 | Yao et al. ................. 204/193.3 |
| 6,201,208 B1 * | 3/2001 | Wendt et al. ........... 219/121.41 |
| 6,218,196 B1 * | 4/2001 | Ise et al. ..................... 438/689 |
| 6,231,777 B1 * | 5/2001 | Kofuji et al. .................. 216/71 |

OTHER PUBLICATIONS

Kofuji et al., "Reduction In the Local Charge Build Up with Electron Acceleration Pulse Bias", Dry Process Symposium, 1995, pps. 39–44.
Patent Abstracts of Japan, 10270419, Oct. 1998, 1 page.
Patent AbstRacts of Japan, 11224796, Aug. 1999, 1 page.
International Search Report dated Mar. 28, 2002.

* cited by examiner

Primary Examiner—Benjamin L. Utech
Assistant Examiner—Lan Vinh
(74) Attorney, Agent, or Firm—TraskBritt (57) ABSTRACT

A method and apparatus for providing a positive voltage spike to a semiconductor substrate pedestal during a portion of a high voltage power bias oscillation cycle to reduce or eliminate the detrimental effects of feature charging during the operation of a plasma reactor.

39 Claims, 4 Drawing Sheets

METHODS FOR USE OF PULSED VOLTAGE IN A PLASMA REACTOR

BACKGROUND OF THE INVENTION

1. Field of the Invention

The present invention relates to plasma reactor apparatus and processes. More specifically, the present invention relates to spiking the voltage to a semiconductor substrate pedestal during a portion of a positive voltage power bias oscillation cycle to reduce or eliminate the detrimental effects of feature charging during the operation of a plasma reactor.

2. State of the Art

Higher performance, lower cost, increased miniaturization of electronic components, and greater density of integrated circuits are ongoing goals of the computer industry. One commonly used technique to increase the density of integrated circuits involves stacking of multiple layers of active and passive components one atop another to allow for multilevel electrical interconnection between devices formed on each of these layers. This multilevel electrical interconnection is generally achieved with a plurality of metal-filled vias ("contacts") extending through dielectric layers which separate the component layers from one another. These vias are generally formed by etching through each dielectric layer by etching methods known in the industry, such as plasma etching. Plasma etching is also used in the forming of a variety of features for the electronic components of integrated circuits.

In plasma etching, a glow discharge is used to produce reactive species, such as atoms, radicals, and/or ions, from relatively inert gas molecules in a bulk gas, such as a fluorinated gas, such as $CF_4$, $CHF_3$, $C_2F_6$, $CH_2F_2$, $SF_6$, or other freons, and mixtures thereof, in combination with a carrier gas, such as Ar, He, Ne, Kr, $O_2$, or mixtures thereof Essentially, a plasma etching process comprises: 1) reactive species are generated in a plasma from the bulk gas, 2) the reactive species diffuse to a surface of a material being etched, 3) the reactive species are absorbed on the surface of the material being etched, 4) a chemical reaction occurs which results in the formation of a volatile by-product, 5) the by-product is desorbed from the surface of the material being etched, and 6) the desorbed by-product diffuses into the bulk gas.

Figure 4:
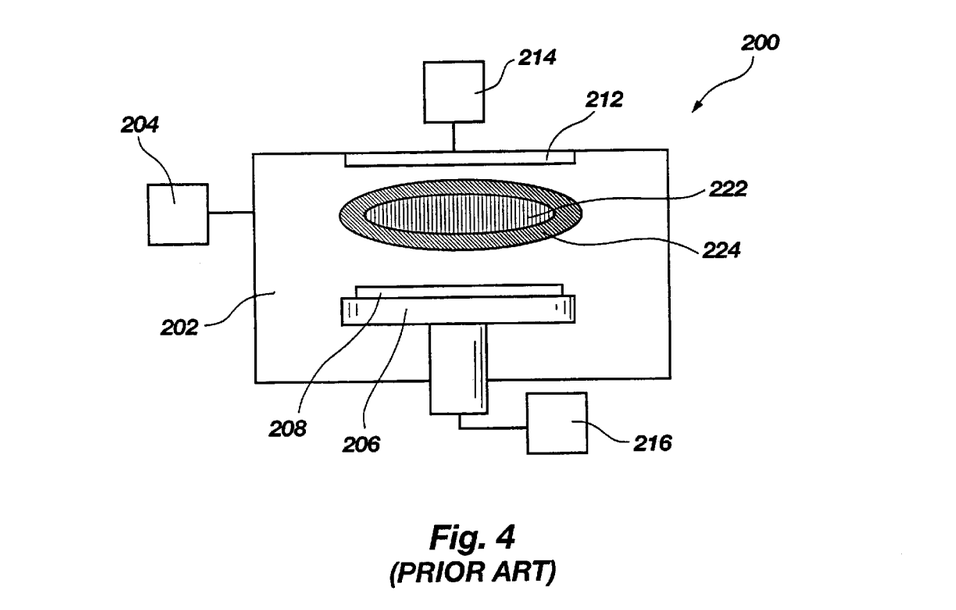
FIG. 4 is a schematic of a prior art plasma etching apparatus.

As illustrated in drawing FIG. 4, an apparatus 200 used in the plasma etching process consists of an etching chamber 202 in electrical communication with a first AC power source 204. The etching chamber 202 further includes a pedestal 206 to support a semiconductor substrate 208 and an electrode 212 opposing the pedestal 206. The electrode 212 is in electrical communication with a second AC power source 214. The pedestal 206 may have either an AC (alternating current) bias source or DC (direct current) bias source 216.

In the etching chamber 202, a plasma 222 is maintained by inductively coupling energy from the first power source 204 into the plasma 222 which comprises mobile, positively and negatively charged particles. An electric field, or bias voltage, develops in a sheath layer 224 around the plasma 222, accelerating the electrons and ions (not shown) toward the semiconductor substrate 208 by electrostatic coupling.

Figure 5:
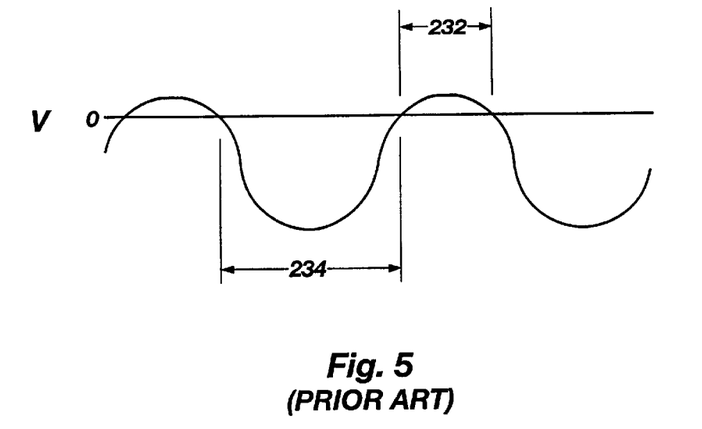
FIG. 5 is an idealized graph of a prior art oscillating voltage profile of a plasma etching apparatus pedestal.

To assist with the etching, the potential difference between the plasma 222 and the semiconductor substrate 208 can be modulated by applying an oscillating bias power from the pedestal power bias source 216 to the pedestal 206, as illustrated in drawing FIG. 5 (showing the voltage profiles during such oscillation). During the positive voltage phase 232, the substrate collects electron current from electrons that have enough energy to cross the sheath. The difference between the instantaneous plasma potential and the surface potential defines the sheath potential drop. Since the plasma potential is more positive than the surface potential, this drop has a polarity that retards electron flow. Hence, only electrons with energy larger than this retarding potential are collected by the substrate. During the negative voltage phase 234, positive ions are collected by the substrate. These ions are accelerated by the sheath voltage drop and strike the substrate.

However, it is known that the plasma etching process (as well as ion implantation and other charge beam processes) may cause damage to the semiconductor substrate and to the devices and circuits formed therein or thereon. In particular, electrical charging is a well-known problem which can occur during the plasma processing of semiconductor devices, leading to the degradation of the device performance.

Figure 6:
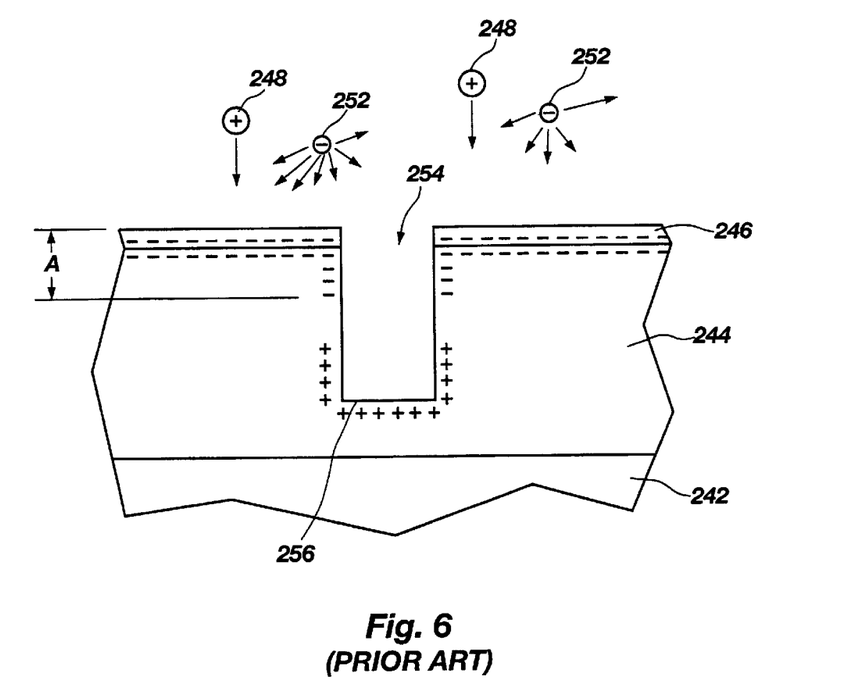
FIG. 6 is a cross-sectional view of a via during a prior art etching process which results in the phenomenon of feature charging.

Illustrated in drawing FIG. 6 is the phenomenon of electrical charging on a semiconductor device in the process of a plasma etch. A material layer 244 to be etched is shown layered over a semiconductor substrate 242. A patterned photoresist layer 246 is provided on the material layer 244 for the etching of a via. During the plasma etching process, the patterned photoresist layer 246 and material layer 244 are bombarded with positively charged ions 248 and negatively charged electrons 252 (i.e., the reactive species). This bombardment results in a charge distribution being developed on the patterned photoresist layer 246 and/or the semiconductor substrate 242. This charge distribution is commonly called "feature charging."

In order for feature charging to occur, the positively charged ions 248 and the negatively charged electrons 252 must become separated from one another. The positively charged ions 248 and negatively charged electrons 252 become separated by virtue of the structure being etched. As the structure (in this example a via 254) is formed by etching, the aspect ratio (height-to-width ratio) becomes greater and greater. During plasma etching, the positively charged ions 248 are accelerated (e.g., as a result of a DC bias at the semiconductor substrate 242) toward the patterned photoresist layer 246 and the material layer 244 in a relatively perpendicular manner, as illustrated by the arrows adjacent positively charged ions 248. The negatively charged electrons 252, however, are less affected by the DC bias at the semiconductor substrate 242 and, thus, move in a more random isotropic manner, as depicted by the arrows adjacent negatively charged electrons 252. This results in an accumulation of a positive charge at a bottom 256 of via 254 because, on average, positively charged ions 248 are more likely to travel vertically toward the substrate 208 than are negatively charged electrons 252. Thus, any structure with a high enough aspect ratio tends to charge more negatively at photoresist layer 246 and an upper portion of the material layer 244 to a distance A (i.e., illustrated with "−" indica) and more positively at the via bottom 256 and the sidewalls 258 of the via 254 proximate the via bottom 256 (i.e., illustrated with "+" indica).

Figure 7:
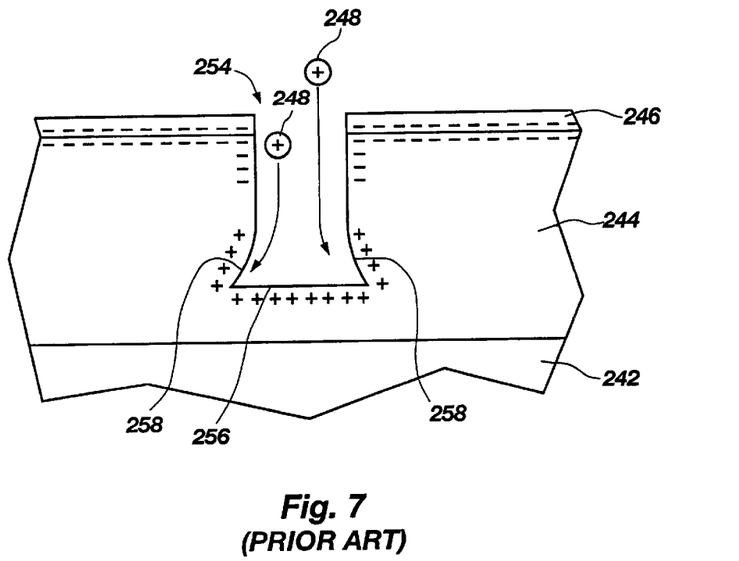
FIG. 7 is a cross-sectional view of a via during a prior art etching process wherein feature charging results in the deflection of positively charged ions away from the bottom of the via and toward the sidewalls of the via.

As shown in drawing FIG. 7, the positively charged via bottom 256 deflects the positively charged ions 248 away from the via bottom 256 and toward the sidewalls 258 of the via 254, as a result of charge repulsion. The deflection results in an etching of the sidewalls 258 proximate the via bottom 256, known as "notching". Furthermore, the presence of the positively charged via bottom 256 slows the positively charged ions 248 as they approach the positively charged via bottom 256, thereby reducing etching efficiency.

Figure 8:
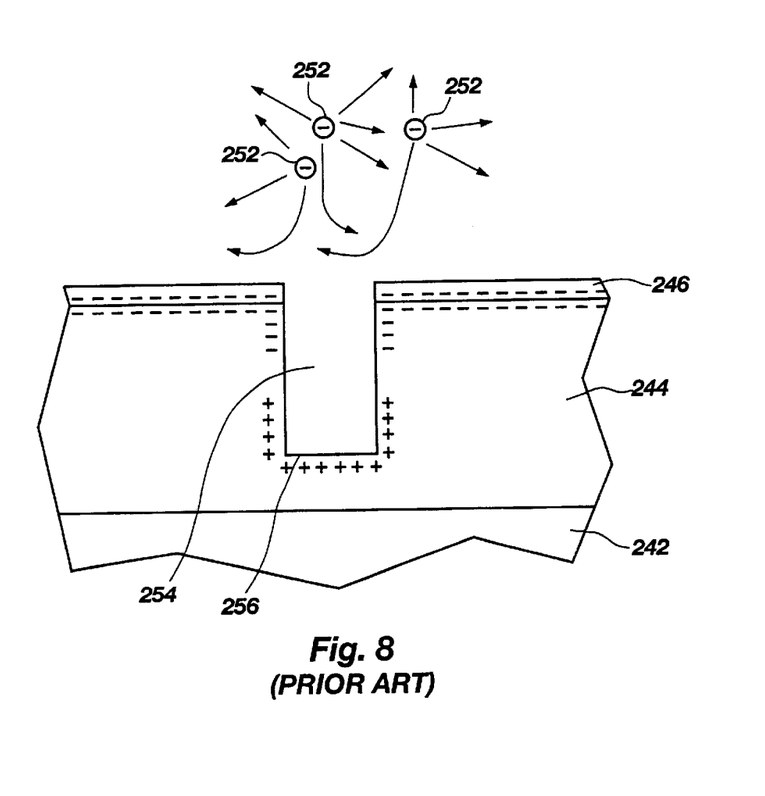
FIG. 8 is a cross-sectional view of a via during a prior art etching process wherein feature charging results in the deflection of negatively charged electrons away from entering the via or slows the negatively charged electrons as they enter the via.

As shown in drawing FIG. 8, the negatively charged photoresist layer 246 and the upper portion of the material layer 244 deflect the negatively charged electrons 252 away from entering the via 254 or slows the negatively charged electrons 252 as they enter the via 254, both caused by charge repulsion and both of which reduce etching efficiency.

Thus, it can be appreciated that it would be advantageous to develop an apparatus and a process of utilizing a plasma reactor which eliminates or lessens the effect of feature charging, while using inexpensive, commercially available, semiconductor device fabrication components and without requiring complex processing steps.

SUMMARY OF THE INVENTION

The present invention relates to an apparatus and method of both increasing the energy of electrons striking a material on a semiconductor substrate and reorienting electrons generated in a plasma reactor to strike a material on a semiconductor substrate in a substantially perpendicular trajectory, both of which reduce feature charging.

One embodiment of the present invention comprises an etching chamber in electrical communication with a first power source. The etching chamber further includes a pedestal to support a semiconductor substrate and an electrode opposing the pedestal. The electrode is in electrical communication with a first power source. The pedestal is in electrical communication with a second power source and a pulsed power source. When triggered, the pulsed power source delivers a timed, positive voltage spike to the pedestal. The pulsed power source is preferably in electrical communication with the second power source with a signal line.

As previously discussed, the potential difference between the plasma and the semiconductor substrate can be modulated by applying an oscillating bias power from the pedestal power bias source to the semiconductor substrate. During the positive voltage phase, the substrate collects electron current from electrons that have enough energy to cross the sheath. The difference between the instantaneous plasma potential and the surface potential defines the sheath potential drop. Since the plasma potential is more positive than the surface potential, this drop has a polarity that retards electron flow. Hence, only electrons with energy larger than this retarding potential are collected by the substrate. During the negative voltage phase 234, positive ions are collected by the substrate. These ions are accelerated by the sheath voltage drop and strike the substrate.

Negatively charged electrons are less affected by the typical DC bias at the semiconductor substrate than are positively charged ions and, thus, move in a more random manner, as depicted by the arrows adjacent negatively charged electrons. However, providing a positive voltage spike to the pedestal according to the present invention alters the difference between the potential of the plasma and the potential of the semiconductor substrate for a part of the positive voltage phase. The voltage spiking of the pedestal, thus, reorients the trajectory of negatively charged electrons into a more perpendicular path with respect to the semiconductor substrate. The reoriented trajectories result in more negatively charged electrons entering into a feature (such as a via being etched into a material layer over a semiconductor substrate) and increase the energy of the negatively charged electrons incident on the material layer to be etched, both of which increase etching efficiency. Additionally, the strong positive field at the bottom of the via (i.e., illustrated with "+" indicia) accelerates the negatively charged electrons toward the via, which results in the negatively charged electron striking the bottom of the via with higher energy. The increase in negatively charged electrons entering the via also reduces feature charging because the negative charge which tends to build up at the photoresist layer and an upper portion of the material layer, as previously discussed, penetrates deeper into the via a distance A' (i.e., illustrated with "−" indicia). The deeper penetration of the negative charge distributes the negative charge over a greater volume or area, thereby reducing the local intensity of the negative charge which reduces or eliminates the negative charge's tendency to repel the negatively charged electrons from the via. Further, the deeper penetration of the negative charge reduces the positive charge buildup at the sidewalls of the via, thereby reducing, minimizing, or eliminating the previously discussed detrimental effect on the positively charged ions entering the via. In other words, providing a positive voltage spike to the pedestal reduces, minimizes or eliminates the problems associated with feature charging.

The delivery of the positive voltage spike is preferably controlled by the power output of the pulsed power source. Thus, when the power output of the second power source reaches a predetermined level, a signal is sent from the second power source (or from a sensor (not shown) coupled with the second power source) to the pulsed power source via the signal line. When the signal is received by the pulsed power source, the pulsed power source provides a positive voltage spike to the pedestal for a predetermined duration of time.

It is, of course, understood that if the second power source is capable of providing a positive voltage spike, the pulsed power source will not be necessary. When the power output level of the second power bias source is reached, a positive voltage spike is generated by the second power source and delivered to the pedestal for a predetermined duration of time.

Thus, the present invention is capable of providing a simple and controllable method of affecting the quality and efficiency of plasma etching and is easily implemented on most existing plasma reactors.

Although the examples presented are directed to the formation of a via, it is understood that the present invention may be utilized in a variety of feature formation and plasma processes.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
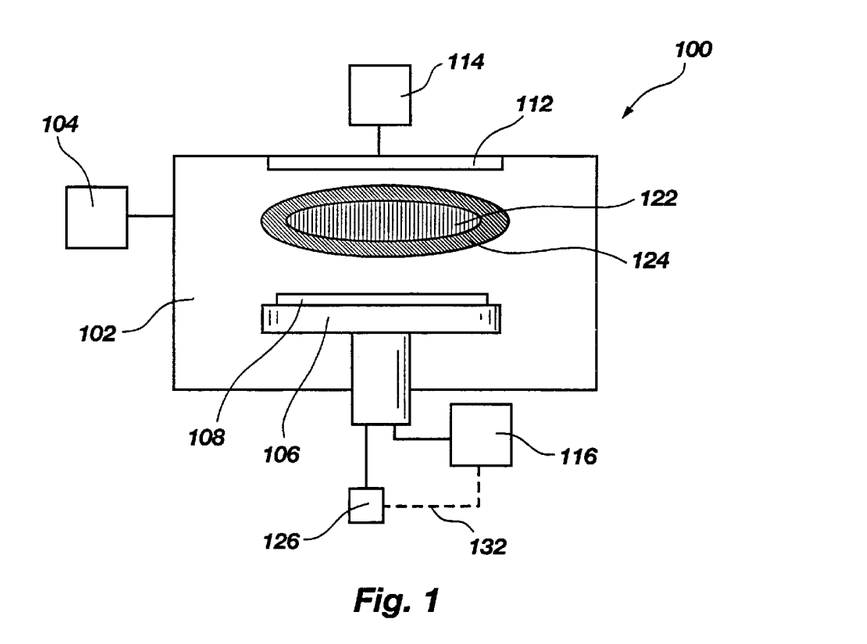
FIG. 1 is a schematic of a plasma etching apparatus according to the present invention.
Figure 2:
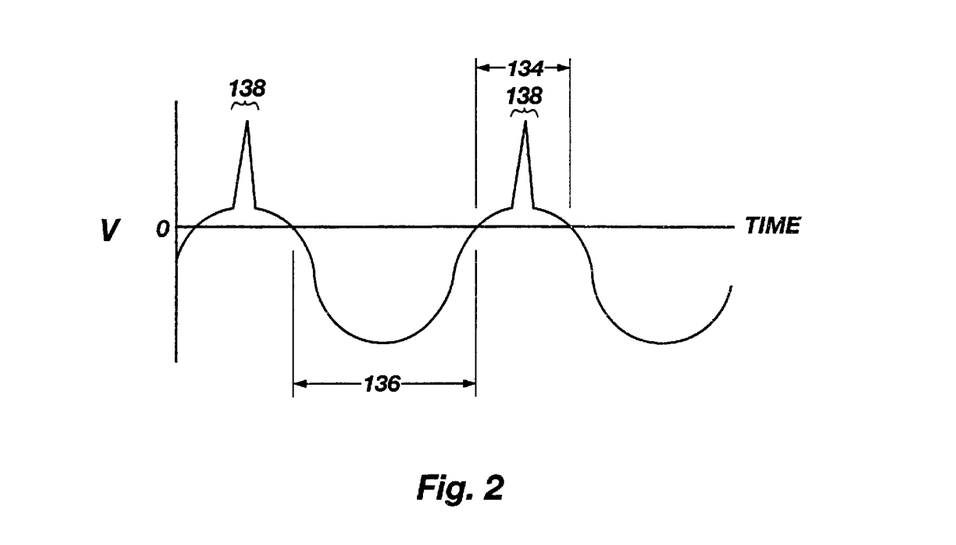
FIG. 2 is an idealized graph of an oscillating voltage profile of a plasma etching apparatus pedestal according to the present invention.
Figure 3:
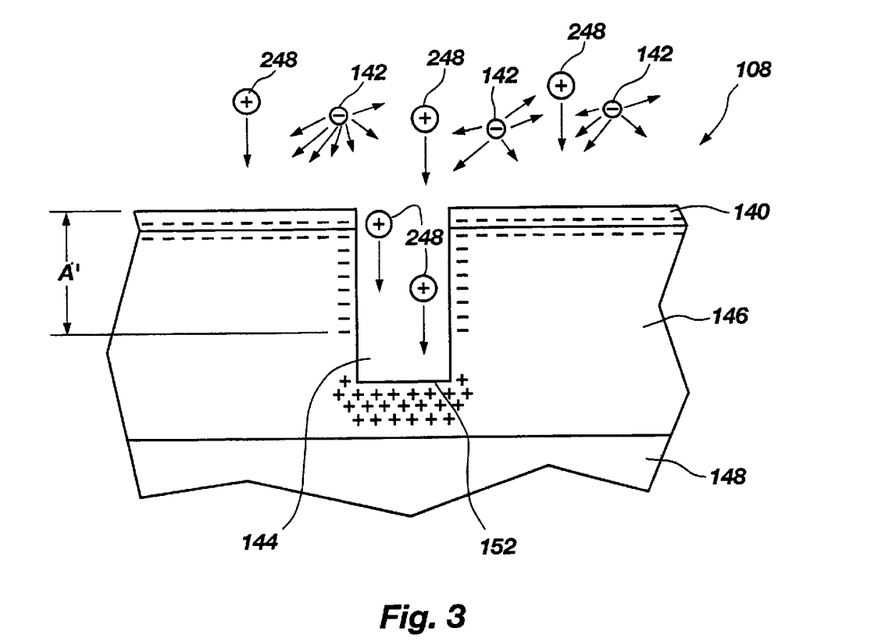
FIG. 3 is a cross-sectional view of a via during an etching process according to the present invention.

Illustrated in drawing FIGS. 1 through 3 are various schematics, views, and graphs of the present invention. It should be understood that the illustrations are not meant to be actual views of any particular semiconductor device, but are merely idealized representations which are employed to more clearly and fully depict the formation of contact interfaces in the present invention than would otherwise be possible. Additionally, elements common between drawing FIGS. 1 through 3 retain the same numerical designation.

As illustrated in drawing FIG. 1, one embodiment of an etching apparatus 100 of the present invention comprises an etching chamber 102 in electrical communication with a first power source 104, such as an AC power source, a microwave power source, etc. The etching chamber 102 further includes a pedestal 106 to support a semiconductor substrate 108 and an electrode, typically a coil or coils, 112 opposing the pedestal 106. The electrode 112 is in electrical communication with power source 114. The pedestal 106 is in electrical communication with a second power source 116.

In the etching chamber 102, a plasma 122 is maintained by inductively coupling energy from the first power source 104 into the plasma 122, which comprises mobile, positively and negatively charged particles. An electric field, or bias voltage, develops in a sheath layer 124 around the plasma 122, accelerating the electrons and ions (not shown) toward the semiconductor substrate 108 by electrostatic coupling.

The pedestal 106 is further in electric communication with a secondary pulsed power source 126. When triggered, the secondary pulsed power source 126 delivers a positive voltage spike to the pedestal 106. The second power source 116 is preferably in electrical communication with the secondary pulsed power source 126 with a signal line 132.

As previously discussed, the potential difference between the plasma 122 and the semiconductor substrate 108 can be modulated by applying an oscillating bias power from the secondary pulsed power source 126 to the semiconductor substrate 108, as illustrated in drawing FIG. 2 (showing the voltage profile during such oscillation). During the positive voltage phase 134, the deposition of the reactant species onto the semiconductor substrate 108 proceeds at a high rate. During the negative voltage phase 136, the diffusion of reaction by-products away from the semiconductor substrate 108 proceeds at a high rate. However, as also illustrated in drawing FIG. 2, the present invention comprises the delivery of a positive power spike to the pedestal 106 during the positive voltage phase 134 (i.e., during the time the electrons flow to the wafer) for a duration 138 of time.

As previously discussed and illustrated in prior art drawing FIG. 6, negatively charged electrons 252 are less affected by the typical DC bias at the semiconductor substrate than are positively charged ions and, thus, move in a more random manner, as depicted by the arrows adjacent negatively charged electrons 252 in prior art drawing FIG. 6. However, the delivery of a positive voltage spike to the pedestal 106, according to the present invention, alters the difference between the potential of the plasma 122 and the potential of the semiconductor substrate 108 for a part of the positive voltage phase 134, as shown in drawing FIG. 2. The delivery of the positive voltage spike to the pedestal 106, thus, reorients the trajectory of negatively charged electrons 142 into a more perpendicular path with respect to the semiconductor substrate 108, as shown in drawing FIG. 3. The reoriented trajectories result in more negatively charged electrons 142 accelerating toward the semiconductor substrate 108 and entering into the feature, specifically shown as an opening or via 144 being etched through a photoresist material 140 into a material layer 146 over a semiconductor support 148, and increases the energy of the negatively charge electrons 142 incident on the material layer 146, both of which increase etching efficiency. Additionally, a strong positive field at the bottom of the opening or via 144 (i.e., illustrated with "+" indica) which results from the positive voltage spike accelerates the negatively charged electrons 142 toward the bottom of the via 144, which results in the negatively charged electrons 142 striking the bottom of the via 144 with higher energy (i.e., the use of the positive voltage spike permits control of the driving force for the electron acceleration). The increase in negatively charged electrons 142 entering the opening or via 144 also reduces feature charging because the negative charge which tends to build up at photoresist layer 140 and an upper portion of the material layer 146, as previously discussed, penetrates deeper into the via a distance A' (i.e., illustrated with "−" indica). The deeper penetration of the negative charge distributes the negative charge over a greater area, thereby reducing or eliminating its detrimental effect on the negatively charged electrons 142. Further, the deeper penetration of the negative charge reduces the positive charge buildup at the sidewalls adjacent the via 152, thereby reducing or eliminating the previously discussed detrimental effect on the positively charged ions 248 entering the via 144. In other words, the positive voltage spike on the pedestal 106 reduces, minimizes or eliminates the problems associated with feature charging.

Referring to drawing FIG. 1, the secondary pulsed power source 126 is preferably controlled by the power output of the second power source 116. Thus, when the power output of second power source 116 reaches a predetermined level, a signal is sent from the second power source 116 (or from a sensor (not shown) coupled with the second power source 116) to the secondary pulsed power source 126 via the signal line 132. When the signal is received by the secondary pulsed power source 126, the secondary pulsed power source 126 delivers a positive voltage spike to the pedestal 106 for a predetermined duration of time. Thus, the positive voltage spike can be controlled to occur at any point and for any duration during the high voltage cycle to achieve the desired etching results for a particular semiconductor material.

It is, of course, understood that if the second power source 116 is capable of providing a positive voltage spike, the secondary pulsed power source 126 will not be necessary. When the power output of the second power source 116 is reached, a positive voltage spike is generated by the second power source 116 and delivered to the pedestal 106 for a predetermined duration of time.

It is further understood that an internal device, such as a microprocessor, may control both the oscillations of the second power source 116 and the delivery of the positive voltage spike, whether generated by the second power source 116 or the secondary pulsed power source 126.

Thus, the present invention is capable of providing a simple and controllable method of affecting the quality and efficiency of plasma etching and is easily implemented on most existing plasma reactors. The present invention is useful in etching apertures having a length-to-diameter ratio of 5:1 or greater in insulating materials deposited by plasma enchanced chemical vapor deposition techniques. Such insulating materials include oxides, nitrides, polymers, combinations thereof, etc. Furthermore, although the examples presented are directed to the formation of an opening or via, it is understood that the present invention may be utilized in a variety of feature formation and plasma processes.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of operating a plasma reactor comprising:
   providing a plasma reactor including a pedestal for supporting a semiconductor substrate and a power source in electrical communication with said pedestal;
   delivering an electrical signal to said pedestal from said power source, wherein a voltage of said electrical signal oscillates between a positive voltage phase and a negative voltage phase; and
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase.

2. The method of claim 1, wherein said delivering said positive voltage spike to said pedestal further comprises:
   monitoring said voltage of said positive voltage phase until said voltage reaches a predetermined voltage level; and
   delivering said positive voltage spike to said pedestal for a duration of time during said electrical signal positive voltage phase when said predetermined voltage level is reached.

3. The method of claim 1, wherein said delivering said positive voltage spike to said pedestal comprises generating a positive voltage spike within said power source and delivering said positive voltage spike to said pedestal during said electrical signal positive voltage phase.

4. A method of forming an opening for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:
   placing a semiconductor substrate on said pedestal, said semiconductor substrate having a material layer thereover and a photoresist layer patterned on said material layer;
   generating a plasma above said semiconductor substrate;
   delivering an electrical signal to said pedestal from said power source, wherein a voltage of said electrical signal oscillates between a positive voltage phase and a negative voltage phase; and
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase.

5. The method of claim 4, wherein said delivering said positive voltage spike to said pedestal further comprises:
   monitoring said voltage of said positive voltage phase until said voltage reaches a predetermined voltage level; and
   delivering said positive voltage spike to said pedestal for a duration of time during said electrical signal positive voltage phase when said predetermined voltage level is reached.

6. The method of claim 4, wherein said delivering said positive voltage spike to said pedestal comprises generating a positive voltage spike within said power source and delivering said positive voltage spike to said pedestal during said electrical signal positive voltage phase.

7. The method of claim 4, wherein said delivering said positive voltage spike to said pedestal comprises generating a positive voltage spike within a pulsed power source and delivering said positive voltage spike to said pedestal during said electrical signal positive voltage phase.

8. A method of forming an opening in an insulating material deposited using a plasma enhanced chemical vapor deposition technique for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:
   placing a semiconductor substrate on said pedestal, said semiconductor substrate having a material layer thereover and a photoresist layer patterned on said material layer;
   generating a plasma above said semiconductor substrate;
   delivering an electrical signal to said pedestal from said power source, wherein a voltage of said electrical signal oscillates between a positive voltage phase and a negative voltage phase;
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase; and
   forming at least a portion of an opening in an insulating material.

9. The method of claim 8, wherein said delivering said positive voltage spike to said pedestal further comprises:
   monitoring said voltage of said positive voltage phase until said voltage reaches a predetermined voltage level; and
   delivering said positive voltage spike to said pedestal for a duration of time during said electrical signal positive voltage phase when said predetermined voltage level is reached.

10. The method of claim 8, wherein said delivering said positive voltage spike to said pedestal comprises generating a positive voltage spike within said power source and delivering said positive voltage spike to said pedestal during said electrical signal positive voltage phase.

11. The method of claim 8, wherein said delivering said positive voltage spike to said pedestal comprises generating a positive voltage spike within a pulsed power source and delivering said positive voltage spike to said pedestal during said electrical signal positive voltage phase.

12. A method of forming an opening in an insulating material deposited using a plasma enhanced chemical vapor deposition technique for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:

placing a semiconductor substrate on said pedestal, said semiconductor substrate having a material layer thereover and a photoresist layer patterned on said material layer;

generating a plasma above said semiconductor substrate;

delivering an electrical signal to said pedestal from said power source, wherein a voltage of said electrical signal oscillates between a positive voltage phase and a negative voltage phase;

delivering a positive voltage spike to said pedestal during said electrical signal positive voltage phase,
wherein said delivering said positive voltage spike to said pedestal comprises generating a positive voltage spike within a secondary power source and delivering said positive voltage spike to said pedestal during said electrical signal positive voltage phase; and forming at least a portion of an opening in an insulating material, said portion of an opening having a ratio of height to diameter of at least 5:1.

13. The method of claim 12, wherein said delivering said positive voltage spike to said pedestal further comprises:

monitoring said voltage of said positive voltage phase until said voltage reaches a predetermined voltage level; and delivering said positive voltage spike to said pedestal for a duration of time during said electrical signal positive voltage phase when said predetermined voltage level is reached.

14. The method of claim 12, wherein said delivering said positive voltage spike to said pedestal comprises generating a positive voltage spike within said power source and delivering said positive voltage spike to said pedestal during said electrical signal positive voltage phase.

15. The method of claim 12, wherein said delivering said positive voltage spike to said pedestal comprises generating a positive voltage spike within a pulsed power source and delivering said positive voltage spike to said pedestal during said electrical signal positive voltage phase.

16. A method of forming an opening in an insulating material for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:

placing a semiconductor substrate on said pedestal, said semiconductor substrate having a material layer thereover and a photoresist layer patterned on said material layer, said material layer deposited by plasma enhanced chemical vapor deposition;

generating a plasma above said semiconductor substrate;

delivering an electrical signal to said pedestal from said power source, wherein a voltage of said electrical signal oscillates between a positive voltage phase and a negative voltage phase;

delivering a positive voltage spike to said pedestal during said electrical signal positive voltage phase,
wherein said delivering said positive voltage spike to said pedestal comprises generating a positive voltage spike within a secondary power source and delivering said positive voltage spike to said pedestal during said electrical signal positive voltage phase; and forming at least a portion of an opening in an insulating material.

17. The method of claim 16, wherein said delivering said positive voltage spike to said pedestal further comprises:

monitoring said voltage of said positive voltage phase until said voltage reaches a predetermined voltage level; and delivering said positive voltage spike to said pedestal for a duration of time during said electrical signal positive voltage phase when said predetermined voltage level is reached.

18. The method of claim 16, wherein said delivering said positive voltage spike to said pedestal comprises generating a positive voltage spike within said power source and delivering said positive voltage spike to said pedestal during said electrical signal positive voltage phase.

19. The method of claim 16, wherein said delivering said positive voltage spike to said pedestal comprises generating a positive voltage spike within a pulsed power source and delivering said positive voltage spike to said pedestal during said electrical signal positive voltage phase.

20. A method of forming an opening in an insulating material for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:

placing a semiconductor substrate on said pedestal, said semiconductor substrate having a material layer thereover and a photoresist layer patterned on said material layer, said material layer deposited by plasma enhanced chemical vapor deposition, said material including one of an oxide material, a nitride material, and a polymer;

generating a plasma above said semiconductor substrate;

delivering an electrical signal to said pedestal from said power source, wherein a voltage of said electrical signal oscillates between a positive voltage phase and a negative voltage phase;

delivering a positive voltage spike to said pedestal during said electrical signal positive voltage phase,
wherein said delivering said positive voltage spike to said pedestal comprises generating a positive voltage spike within a secondary power source and delivering said positive voltage spike to said pedestal during said electrical signal positive voltage phase; and forming at least a portion of an opening in an insulating material.

21. The method of claim 20, wherein said delivering said positive voltage spike to said pedestal further comprises:

monitoring said voltage of said positive voltage phase until said voltage reaches a predetermined voltage level; and delivering said positive voltage spike to said pedestal for a duration of time during said electrical signal positive voltage phase when said predetermined voltage level is reached.

22. The method of claim 20, wherein said delivering said positive voltage spike to said pedestal comprises generating a positive voltage spike within said power source and delivering said positive voltage spike to said pedestal during said electrical signal positive voltage phase.

23. The method of claim 20, wherein said delivering said positive voltage spike to said pedestal comprises generating a positive voltage spike within a pulsed power source and delivering said positive voltage spike to said pedestal during said electrical signal positive voltage phase.

24. A method of forming an opening in an insulating material deposited using a plasma enhanced chemical vapor deposition technique for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:
   placing a semiconductor substrate on said pedestal, said semiconductor substrate having a material layer thereover and a photoresist layer patterned on said material layer;
   generating a plasma above said semiconductor substrate;
   delivering an electrical signal to said pedestal from said power source, wherein a voltage of said electrical signal oscillates between a positive voltage phase and a negative voltage phase;
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase; and
   forming at least a portion of an opening having an aspect ratio of height to diameter of greater than 5:1 in an insulating material.

25. The method of claim 24, wherein said delivering said positive voltage spike to said pedestal further comprises:
   monitoring said voltage of said positive voltage phase until said voltage reaches a predetermined voltage level; and
   delivering said positive voltage spike to said pedestal for a duration of time during said electrical signal positive voltage phase when said predetermined voltage level is reached.

26. The method of claim 24, wherein said delivering said positive voltage spike to said pedestal comprises generating a positive voltage spike within said power source and delivering said positive voltage spike to said pedestal during said electrical signal positive voltage phase.

27. The method of claim 24, wherein said delivering said positive voltage spike to said pedestal comprises generating a positive voltage spike within a pulsed power source and delivering said positive voltage spike to said pedestal during said electrical signal positive voltage phase.

28. A method of forming an opening in an insulating material deposited using a plasma enhanced chemical vapor deposition technique for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:
   placing a semiconductor substrate on said pedestal, said semiconductor substrate having a material layer thereover and a photoresist layer patterned on said material layer;
   generating a plasma above said semiconductor substrate;
   delivering an electrical signal to said pedestal from said power source, wherein a voltage of said electrical signal oscillates between a positive voltage phase and a negative voltage phase;
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase; and
   forming at least a portion of an opening in an insulating material, said portion of an opening having a ratio of height to diameter of not less than 5:1.

29. The method of claim 28, wherein said delivering said positive voltage spike to said pedestal further comprises:
   monitoring said voltage of said positive voltage phase until said voltage reaches a predetermined voltage level; and
   delivering said positive voltage spike to said pedestal for a duration of time during said electrical signal positive voltage phase when said predetermined voltage level is reached.

30. The method of claim 28, wherein said delivering said positive voltage spike to said pedestal comprises generating a positive voltage spike within said power source and delivering said positive voltage spike to said pedestal during said electrical signal positive voltage phase.

31. The method of claim 28, wherein said delivering said positive voltage spike to said pedestal comprises generating a positive voltage spike within a pulsed power source and delivering said positive voltage spike to said pedestal during said electrical signal positive voltage phase.

32. A method of forming an opening in an insulating material for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:
   placing a semiconductor substrate on said pedestal, said semiconductor substrate having a material layer thereover and a photoresist layer patterned on said material layer, said material layer deposited by plasma enhanced chemical vapor deposition;
   generating a plasma above said semiconductor substrate;
   delivering an electrical signal to said pedestal from said power source, wherein a voltage of said electrical signal oscillates between a positive voltage phase and a negative voltage phase;
   delivering a positive voltage spike to said pedestal during said electrical signal positive voltage phase,
      wherein said delivering said positive voltage spike to said pedestal comprises generating a positive voltage spike within a secondary power source and delivering said positive voltage spike to said pedestal during said electrical signal positive voltage phase; and
   forming at least a portion of an opening in an insulating material having an aspect ratio of height to diameter of at least 5:1.

33. The method of claim 32, wherein said delivering said positive voltage spike to said pedestal further comprises:

monitoring said voltage of said positive voltage phase until said voltage reaches a predetermined voltage level; and delivering said positive voltage spike to said pedestal for a duration of time during said electrical signal positive voltage phase when said predetermined voltage level is reached.

34. The method of claim 32, wherein said delivering said positive voltage spike to said pedestal comprises generating a positive voltage spike within said power source and delivering said positive voltage spike to said pedestal during said electrical signal positive voltage phase.

35. The method of claim 32, wherein said delivering said positive voltage spike to said pedestal comprises generating a positive voltage spike within a pulsed power source and delivering said positive voltage spike to said pedestal during said electrical signal positive voltage phase.

36. A method of forming an opening in an insulating material for a semiconductor device utilizing a plasma reactor chamber including a pedestal for supporting a semiconductor substrate and a power source in electrical communication with said pedestal, said pedestal including a switch in electrical communication therewith for opening and closing an electrical path, said method comprising:

placing a semiconductor substrate on said pedestal, said semiconductor substrate having a material layer thereover and a photoresist layer patterned on said material layer, said material layer deposited by plasma enhanced chemical vapor deposition, said material including one of an oxide material, a nitride material, and a polymer;

generating a plasma above said semiconductor substrate;

delivering an electrical signal to said pedestal from said power source, wherein a voltage of said electrical signal oscillates between a positive voltage phase and a negative voltage phase;

delivering a positive voltage spike to said pedestal during said electrical signal positive voltage phase, wherein said delivering said positive voltage spike to said pedestal comprises generating a positive voltage spike, within a secondary power source and delivering said positive voltage spike to said pedestal during said electrical signal positive voltage phase; and forming at least a portion of an opening in an insulating material having an aspect ratio of height to diameter of at least 5:1.

37. The method of claim 36, wherein said delivering said positive voltage spike to said pedestal further comprises:

monitoring said voltage of said positive voltage phase until said voltage reaches a predetermined voltage level; and delivering said positive voltage spike to said pedestal for a duration of time during said electrical signal positive voltage phase when said predetermined voltage level is reached.

38. The method of claim 36, wherein said delivering said positive voltage spike to said pedestal comprises generating a positive voltage spike within said power source and delivering said positive voltage spike to said pedestal during said electrical signal positive voltage phase.

39. The method of claim 36, wherein said delivering said positive voltage spike to said pedestal comprises generating a positive voltage spike within a pulsed powder source and delivering said positive voltage spike to said pedestal during said electrical signal positive voltage phase.

* * * * *

UNITED STATES PATENT AND TRADEMARK OFFICE
CERTIFICATE OF CORRECTION

PATENT NO. : 6,544,895 B1 Page 1 of 1
DATED : April 8, 2003
INVENTOR(S) : Kevin G. Donohoe It is certified that error appears in the above-identified patent and that said Letters Patent is hereby corrected as shown below:

Title page,
Item [56], References Cited, OTHER PUBLICATIONS, change "AbstRacts" to
-- Abstracts --

Column 1,
Line 37, insert a period after "thereof"

Column 6,
Line 40, before "152" change "via" to -- bottom --

Column 14,
Line 32, change "powder" to -- power --

Signed and Sealed this

Twenty-third Day of September, 2003

JAMES E. ROGAN
*Director of the United States Patent and Trademark Office*